United States Patent [19]

Dowben et al.

[11] Patent Number: 4,980,198

[45] Date of Patent: Dec. 25, 1990

[54] LASER CVD AND PLASMA CVD OF $CrO_2$ FILMS AND COBALT DOPED $CrO_2$ FILMS USING ORGANOMETALLIC PRECURSORS

[75] Inventors: Peter A. Dowben, Dewitt, N.Y.; Marshall Onellion, Stoughton, Wis.

[73] Assignee: Syracuse University, Syracuse, N.Y.

[21] Appl. No.: 443,738

[22] Filed: Nov. 30, 1989

[51] Int. Cl.[5] .......................... B05D 3/06; B05D 5/12
[52] U.S. Cl. .................... 427/53.1; 427/39; 427/38; 427/54.1; 427/255.3; 427/128; 427/131; 427/255.7; 427/314
[58] Field of Search ............ 427/53.1, 54.1, 255.3, 427/255.7, 255.1, 255.2, 314, 39, 38, 128, 126.3, 131

[56] References Cited

U.S. PATENT DOCUMENTS

| | | | |
|---|---|---|---|
| 4,321,073 | 3/1982 | Blair | 65/3.31 |
| 4,717,584 | 1/1988 | Aoki et al. | 427/38 |
| 4,751,149 | 6/1988 | Vijayakumar et al. | 427/126.3 |
| 4,756,927 | 7/1988 | Black et al. | 427/531.1 |
| 4,817,557 | 4/1989 | Diem et al. | 118/719 |
| 4,868,005 | 9/1980 | Ehrlich et al. | 427/53.1 |
| 4,925,700 | 5/1990 | Brezoczky et al. | 427/38 |

OTHER PUBLICATIONS

Sheward et al., "The Deposition of Molybdenum and Tungsten Coatings on Gun Steel Substrates by a Plasma Assisted CVD Technique", Vacuum, vol. 36 (1–3), 1986, pp. 37–41.

*Primary Examiner*—Norman Morgenstern
*Assistant Examiner*—Roy V. King
*Attorney, Agent, or Firm*—Wall and Roehrig

[57] ABSTRACT

Chromium dioxide is deposited as a ferromagnetic layer onto selected portions of a substrate or over the entire substrate. Chromium hexacarbonyl vapor is introduced into a vacuum deposition chamber at e.g. 10 milliTorr and oxygen is introduced at e.g. 15 to 100 milliTorr. A UV laser beam is focused onto the substrate to form the $CrO_2$ layer photolytically. The $CrO_2$ layer can also be deposited by RF plasma deposition. This technique can also be employed for depositing $MoC_2$, $WC_2$, $Mo_2\phi_3$, $MoO_2$ or $WO_2$. Magnetic recording or memory devices are produced without the high failure rate typical of the prior art sputtering technique.

14 Claims, No Drawings

LASER CVD AND PLASMA CVD OF CRO₂ FILMS AND COBALT DOPED CRO₂ FILMS USING ORGANOMETALLIC PRECURSORS

BACKGROUND OF THE INVENTION

This invention relates to magnetic thin films and is more especially directed to deposition of thin films of chromium dioxide onto all or specific portions of the surface of a substrate.

Chrome oxide, i.e., $CrO_2$, has become highly favored as a magnetic recording medium because of its desirable ferromagnetic properties. Currently, magnetic recording material is typically produced by sputtering chromium dioxide onto a substrate such as tape or disk material. Sputtering has a very high failure rate, and this raises the average cost of producing the magnetic medium.

Deposition of thin films of $CrO_2$ has been studied but no suitable or reliable means to produce chrome oxide recording media has been found, at least selectively on the micron scale.

The decomposition of metal hexacarbonyls to form metallic thin films has been studied, but there has been a propensity for the films formed from decomposition of hexacarbonyls to incorporate contaminants.

OBJECTS AND SUMMARY OF THE INVENTION

It is an object of this invention to provide an effective, reliable process for depositing a magnetic film, to wit $CrO_2$ on a substrate.

It is another object of this invention to provide a process whereby the magnetic film can be deposited at room temperature.

It is a further object of the invention to provide a process in which the magnetic film can be deposited only on predetermined portions of the surface of a substrate, or else uniformly over the entire substrate surface, as required.

According to an aspect of this invention an organometallic material, to wit, chromium hexacarbonyl, is decomposed in a vacuum chamber by a laser assisted or a plasma assisted chemical vapor deposition technique. A suitable substrate, which can be a semiconductor wafer or a glass or plastic sheet, is placed into a chamber which is evacuated down to a typical background pressure of about $10^{-5}$ Torr, i.e., $10^{-2}$ milliTorr. The organometallic material is introduced as a vapor into the chamber, providing a partial pressure of about 10 milliTorr. This pressure is not especially critical. Oxygen or another oxidizing agent such as NO is introduced at a suitable pressure, e.g. 15 to 100 milliTorr. The chromium hexacarbonyl is subjected to photolytic or plasma decomposition. In the case of photolytic deposition, a laser beam is directed at the portion of the substrate on which the chrome oxide is to be deposited. The substrate is kept near or below room temperature, for example, using a copper block that can be kept cool with chilled water. The decomposition of the hexacarbonyl is surface mediated, and occurs only where the laser beam is incident onto the substrate. The laser beam wavelength is in the ultraviolet range, preferably near 230 nm, but acceptable results were produced using a nitrogen laser having a wavelength of 337 nm. Plasma assisted deposition can employ an RF plasma field e.g., 13.56 MHz, at 200 watts. In this case, the substrate can be heated by a cartridge heater to a temperature of 150° C. to 300° C. (323 K to 573 K). In either case, the $O_2$ or NO partial pressure should be above about 15 milliTorr so that the film is formed as $CrO_2$, rather than $Cr_2O_3$.

For application of molydenum oxide or tungsten oxide films, the organometallic material can be molydenum hexacarbonyl or tungsten hexacarbonyl.

DESCRIPTION OF THE PREFERRED EMBODIMENT

Selective deposition of $CrO_2$ thin films, which can be accomplished with this invention, is of great interest because $CrO_2$ is a ferromagnetic compound at room temperature with a Curie temperature of 118° C. (391 K). These $CrO_2$ films can be magnetized and demagnetized with low input of energy, making them ideal for microminiature magnetic memory applications. The films also have pronounced magneto-optic properties in the visible spectrum, including a substantial Kerr effect.

We have produced chromium dioxide films by photolytic and plasma deposition using $Cr(CO)_6$ and oxygen. Other materials have been employed satisfactorily as well. Chromacene $(C_5H_5)_2 Cr$, $CrO_3$ and benzene chromium $Cr(C_6H_6)_2$ *have been successfully used in place of the chromium hexacarbonyl. Nitrogen monoxide NO or ozone $O_3$* can be used as the oxidizing agent in place of oxygen $O_2$.

A typical vacuum system as is commonly used for vapor deposition can be employed here, and thus need not be described in any detail. In an experiment, a silicon substrate was placed in a solid brass substrate holder inside the vacuum chamber, and the holder was cooled by a chilled water system. Background pressure was about $10^{-5}$ Torr. The chromium hexacarbonyl was introduced into the vapor system by sublimation of the crystalline solid, at a pressure of about 10 milliTorr. This material has a known pressure relation given by the relation $$log_{10} P = 10.63 - 3285/T$$

where P is the pressure in Torr and T is temperature of the hexacarbonyl in degrees Kelvin.

Oxygen was introduced into the chamber at sufficient pressure to produce the desired $CrO_2$, rather than $Cr_2O_3$. Preferably the oxygen should have partial pressure exceeding 15 milliTorr, up to or exceeding 100 milliTorr.

The holder was maintained at temperature between 288 K and 294 K, although this was not critical. At higher temperatures, e.g., up to 315 K, the film surface became somewhat rough.

Photolytic decomposition of the $Cr(CO)_6$ was carried out with a commercial pulsed nitrogen laser in the near ultraviolet (337 nm). The laser beam had a power of 330 mw, which was 4.5 mJ per pulse. The beam dimension was 6 mm × 32 mm and was focused through a quartz window onto the silicon substrate. Photolytic deposition times ranged from 3 hours to 48 hours.

The chrome oxide coatings were examined in place on the silicon substrate, using scanning electron microscopy (SEM), x-ray emission spectroscopy (XES), and Auger electron spectroscopy (AES). Magneto-optic Kerr effect (MOKE) measurements were undertaken with a 5 mw He-Ne laser, two crossed polarizers, and a chopper wheel run at 800 Hz. All measurements were performed in air. The applied magnetic field was changed at a rate of 15 Oerstads per second, to a maximum of 1,500 oe. The reflected light was detected using a photodiode and transduced to a voltage, the signal being obtained using a lock-in amplifier.

XES spectra of the deposited films provided clear evidence of chromium deposition on temperature of the substrate. For example there was found to be a threefold increase in the rate of deposition with six degrees drop, with evidence to indicate that the decomposition is a surface process. At lower temperatures, the surface residence time of the organometallic species increases, increasing the probability of removing a carbonyl ligand before desorption and reevaporation.

The cross-section of gaseous $Cr(CO)_6$ is greater at short wavelengths near 230 nm, although the deposition rate of chromium has been observed to be substantial at longer ultraviolet wave lengths, e.g. 337 nm.

Formation of $CrO_2$ from photolysis of chromium hexacarbonyl results in relatively smooth films for deposition at substrate temperatures up to 294 K. At higher substrate temperatures, e.g. 315 K and above, the film surface becomes somewhat uneven.

At higher temperatures, some interdiffusion of both oxygen and chromium into the silicon substrate was observed. This can lead to non-uniform composition at the interface of the chromium dioxide and the silicon. However, this is not a problem at higher deposition rates as very rapid film growth leads to far more uniform films Also, to prevent diffusion into the silicon, a diffusion barrier can be applied as a sublayer below the chrome oxide.

For very rapid thin film growth where selective area processing is not required, plasma assisted deposition of chromium oxides can be undertaken. In this case, the substrate is placed in any typical plasma reactor whose chamber is evacuated to a background vacuum of e.g. $10^{-5}$ Torr. The sample is maintained at a given temperature, e.g. 242° C. or 515 K, and a $Cr(CO)_6$ partial pressure of 10 mTorr is maintained. With a partial pressure of oxygen between 3 mTorr and 15 mTorr, the film composition is uniformly $Cr_2O_3$, as determined by Auger depth profiling. Fabrication of $CrO_2$ requires oxygen partial pressure in excess of 15 mTorr.

The deposited chrome oxide layers from this process are surprisingly free of contamination. Very little carbonyl incorporation has been observed to occur, despite the high rate of film growth. The rate of film growth under these operating conditions was approximately 3.0 nm/minute.

MOKE studies of these $CrO_2$ films showed characteristics of ferromagnetism. It was also clear that antiferromagnetic chrome oxide layers can also be formed.

Because of the low-to-moderate temperatures employed in either method, it is clear that chromium dioxide ferromagnetic coatings can be applied to plastic substrates (e.g. Mylar) or other substrates commonly used in magnetic storage devices.

Cobalt can be doped into these $CrO_2$ films e.g. by introducing a vapor of cobaltocene during or after deposition of the $CrO_2$, $CrO_3$. Also, instead of chromium hexacarbonyl, chromacene $(C_5H_5)_2Cr$ or benzene chromium $(C_6H_6)_2Cr$ can be employed as the chromium-contributing organometallic material. It has also been found that films of oxides of other group VIB metals, i.e. $WO_2$ and $MoO_2$ can be deposited using tungsten hexacarbonyl and molybdenum hexacarbonyl as the organometallic material.

While the invention has been described with reference to preferred embodiments, it is clear that the invention is not limited only to these illustrative embodiments. Rather, many modifications and variations will present themselves to those skilled in the art without departure form the scope and spirit of this invention, as defined in the appended claims.

What is claimed is:

1. Process for depositing on a substrate a film of a magnetic oxide by decomposition of an organometallic precursor selected from the group consisting of Group VIB metal hexacarbonyls, chromacene and benzene chromium, the process comprising placing the substrate into a vacuum deposition chamber; introducing said organometallic precursor into said chamber as a vapor under a suitable pressure; introducing into the chamber an oxidizing agent as a vapor selected from the group consisting of $O_2$, $O_3$ and NO under a suitable pressure greater than the pressure of said organometallic precursor vapor; maintaining the temperature of the substrate at a predetermined level to facilitate deposition onto a surface of said substrate; and applying UV or RF electromagnetic energy in said chamber to decompose the organometallic material and deposit the film of the magnetic oxide.

2. Process for depositing on a substrate a film of a metal oxide by laser-assisted chemical vapor deposition employing an organometallic precursor selected from the group that consists of Group VIB metal hexacarbonyls, chromacene, and benzene chromium the process comprising placing the substrate into a vacuum deposition chamber, introducing into the chamber said organometallic precursor as a vapor under suitable pressure; introducing into the chamber an oxidizing agent as a vapor under a suitable pressure greater than the pressure of said organometallic precursor vapor; maintaining the temperature of the substrate at a temperature below 350 K, and photolytically decomposing the organometallic precursor by focusing onto a predetermined portion of said substrate a laser beam whose wavelength is in the ultraviolet range, to produce said film on said predetermined portion of said substrate.

3. Process according to claim 2 wherein said oxidizing agent is $O_2$.

4. Process according to claim 2 wherein said oxidizing agent is NO.

5. Process according to claim 2 wherein said organometallic precursor is chromium hexacarbonyl introduced at a pressure of substantially 10 milliTorr, and said oxidizing agent is introduced at a pressure of at least 15 milliTorr to produce a film of chromium dioxide.

6. Process according to claim 5 wherein said substrate temperature is maintained between about 288 K and 294 K.

7. Process according to claim 5 whrein said laser beam wavelength is between about 230 nm and 337 nm.

8. Process according to claim 2, further comprising introducing cobaltecene vapor into the chamber to add cobalt as dopant to said film.

9. Process for depositing on a substrate a film of a Group VIB metal dioxide by decomposition of an organometallic precursor selected from type VIB metal hexacarbonyls, chromacene, and benzene chromium the process comprising placing the substrate into a plasma deposition chamber, introducing into the chamber said organometallic material as a vapor under a suitable pressure; introducing into said chamber an oxidizing agent as a vapor under a suitable pressure greater than the pressure of said organometallic precursor vapor; maintaining the temperature of the substrate at substantially 423–573 K and applying RF radiation to the chamber to create a plasma of said organometallic precursor vapor and said oxidizing agent vapor to decompose said organometallic precursor and form said Group VIB metal dioxide film on a surface of said substrate.

10. Process according to claim 9 wherein said oxidizing agent is $O_2$.

11. Process according to claim 9 wherein said oxidizing agent is NO.

12. Process according to claim 9 wherein said organometallic precursor is chromium hexacarbonyl introduced at a pressure of about 10 milliTorr, and said oxidizing agent is introduced at a pressure of at least 15 milliTorr to produce a film of chromium dioxide.

13. Process according to claim 9 wherein said RF radiation is applied at a frequency of substantially 10 to 20 MHz.

14. Process according to claim 9 further comprising introducing cobaltecene vapor into the chamber to add cobalt as a dopant to said metal dioxide film.

* * * * *

UNITED STATES PATENT AND TRADEMARK OFFICE
CERTIFICATE OF CORRECTION

PATENT NO. : 4,980,198
DATED : December 25, 1990
INVENTOR(S) : Peter A. Dowben, et al.

It is certified that error appears in the above—identified patent and that said Letters Patent is hereby corrected as shown below:

column 1, line 5, please insert:

--This invention was made with government support under Grant No. F 30602 88 D0027, awarded by the United States Air Force - Rome Air Development Center. The Government has certain rights in the invention.--

Signed and Sealed this

Twenty-sixth Day of January, 1993

*Attest:*

STEPHEN G. KUNIN

*Attesting Officer*   *Acting Commissioner of Patents and Trademarks*